United States Patent [19]
Hattori

[11] Patent Number: 5,111,471
[45] Date of Patent: May 5, 1992

[54] SEMICONDUCTOR LASER DEVICE

[75] Inventor: Ryo Hattori, Itami, Japan

[73] Assignee: Mitsubishi Denki Kabushiki Kaisha, Japan

[21] Appl. No.: 638,333

[22] Filed: Jan. 7, 1991

[30] Foreign Application Priority Data

Jul. 16, 1990 [JP] Japan .................. 2-189904

[51] Int. Cl.⁵ .................................. H01S 3/19
[52] U.S. Cl. .................................. 372/46
[58] Field of Search .................. 372/46, 45, 44

[56] References Cited

U.S. PATENT DOCUMENTS

| | | | |
|---|---|---|---|
| 4,935,936 | 6/1990 | Nelson et al. | 372/46 |
| 4,949,352 | 8/1990 | Plumb | 372/46 |
| 4,984,244 | 1/1991 | Yamamoto et al. | 372/46 |

FOREIGN PATENT DOCUMENTS

| | | |
|---|---|---|
| 0157555 | 10/1985 | European Pat. Off. . |
| 0301826 | 2/1989 | European Pat. Off. . |
| 62-202985 | 9/1987 | Japan . |
| 63-205981 | 8/1988 | Japan . |
| 63-250886 | 10/1988 | Japan . |
| 63-302585 | 12/1988 | Japan . |
| 1-209777 | 8/1989 | Japan . |
| 1-238182 | 9/1989 | Japan . |

OTHER PUBLICATIONS

Kakimoto et al, "InGaAsP/InP . . . InP Substrate", Optoelectronics, vol. 3, No. 2, 1988, pp. 197–225.
"LD for Optical Fiber Communications", Trigger, 1986, Special Issue, p. 39.

Primary Examiner—James W. Davie
Attorney, Agent, or Firm—Leydig, Voit & Mayer

[57] ABSTRACT

A novel semiconductor laser device includes a P-type semiconductor substrate, an N-type InP current blocking layer on the substrate, a P-type InP buried layer of which has the same thickness as and is surrounded by the first current blocking layer, and a ridge, on the buried layer, having a double heterojunction structure therein and including a stack of a planar P-type first InP cladding layer, a planar InGaAsP active layer, and a planar N-type second InP cladding layer. The ridge has a width of the same order as that of the buried layer. A P-type InP current blocking layer is disposed on the N-type current blocking layer burying the ridge and an N-type contact layer is formed opposite and in contact with the P-type current blocking layer and the N-type cladding layer. The conductivity types of the layers can be reversed.

4 Claims, 4 Drawing Sheets

TO STEP 2(e)

SEMICONDUCTOR LASER DEVICE

This invention relates to a semiconductor laser device, more particularly, a semiconductor laser device with an NPNP current blocking structure which has a stable current blocking capability, and also to a method of making such a semiconductor laser device.

BACKGROUND OF THE INVENTION

FIG. 1 shows a cross-section of a conventional InGaAsP semiconductor laser device shown in, for example, Japanese Published Patent Application No. SHO 63-202985. A P-type InP cladding layer 32 is disposed on a P-type InP substrate 31. On the P-type InP cladding layer 32, an InGaAsP crystalline active layer 33 is disposed, and on the active layer 33, an N-type InP cladding layer 34 is disposed. An N-type InP buried current blocking layer 35 and a P-type InP buried current blocking layer 36 surround the P-type InP cladding layer 32, the InGaAsP active layer 33 and the InP cladding layer 34 which are disposed in a stack. An N-type InP contact layer 37 is disposed on the N-type InP cladding layer 34. Regions 38 shown by dotted-line circles are P-type regions formed by reversing the conductivity type of the N-type InP blocking layer 35 so that the N-type InP blocking layer 35 does not contact the N-type InP cladding layer 34.

In comparison with AlGaAs semiconductor laser devices, an InP semiconductor laser device including an active layer comprising InGaAsP crystals as described above, has a laser oscillation threshold current which is highly sensitive to temperature at a light-emitting point. This high sensitivity to temperature is considered to be attributable to some causes including non-emissive recombination due to the Auger effect, and overflow of injected carriers. For overcoming this problem, the buried structure as shown in FIG. 1 is frequently employed in InP semiconductor laser devices. With such a structure, the NPNP junction structure provides a dual current blocking effect as indicated by a line A-B in FIG. 1, so that current leakage can be minimized. Thus, current can be injected into the active layer 33 with high efficiency so that laser oscillations with a low threshold current and at high temperature can be provided.

In the conventional semiconductor laser device of the structure shown in FIG. 1, however, the NPNP junction current blocking capability could be lost. That is, depending on carrier concentrations and thicknesses of respective layers, the NPNP junction structure enters into thyristor conduction when the laser device is in a certain operating condition. This causes an increase in leakage current, which, in turn, causes an increase in threshold current and degradation of the temperature characteristics of the device.

Particularly critical structural parameters are the thicknesses and carrier concentrations of the N-type InP blocking layer 35 and the P-type InP blocking layer 36 which provide a junction corresponding to a collector junction of a dual-terminal NPNP thyristor structure. More specifically, if the thickness of the respective blocking layers is on the same order as or less than the diffusion length of minority carriers injected due to thermal excitation or the like, the number of minority carriers which move over barriers increases, causing an increase of leakage current and degradation of the temperature characteristic of the device. This is particularly significant when the device is operated at high temperature.

Generally, in order to minimize increases in the leakage current, the N-type InP blocking layer 35 and the P-type InP blocking layer 36 are both doped to a high concentration of $5 \times 10^{18}$ cm$^{-3}$ or higher and have a thickness of 1 $\mu$m or more. However, in the vicinity of the reversed-conductivity P-type regions 38, the thickness of the N-type InP blocking layer 35 is significantly smaller than that of the remaining portion, and the thickness is smaller than the minority carrier diffusion length. Thus, these regions could cause switching of the device into thyristor conduction. In addition, the width of the reversed-conductivity P-type regions 38 can hardly be uniform, and the magnitude of the leakage current is highly dependent on the location, relative to the active layer 33, of the tip end portions of the current blocking layer 35 in the vicinity of the reversed-conductivity P-type regions 38. Like this laser structure, conventional laser devices such as the one shown in FIG. 1 include unstable structural factors as stated above, which are the major causes for low productivity, a low yield, and low reliability.

An object of the present invention is to provide an improved semiconductor laser device free of the above-described problems, and another object is to provide a method of manufacturing such an improved semiconductor laser device. The semiconductor laser device of the present invention includes an NPNP current blocking structure with stable current blocking capability so that the structure rarely enters into a thyristor conduction state.

SUMMARY OF THE INVENTION

A semiconductor laser device according to the present invention includes a semiconductor substrate of a first conductivity type (e.g. P-type), a first InP current blocking layer of a second conductivity type (e.g. N-type) having a sufficient thickness and a sufficient carrier concentration disposed on the substrate, and an InP buried layer of the first conductivity type buried in and surrounded by the first InP current blocking layer. The buried layer has the same thickness as the first current blocking layer on this buried InP layer, a first InP cladding layer of the first conductivity type, an InGaAsP active layer, and a second InP cladding layer of the second conductivity type are substantially planar and arranged in the named order to form a stack. The first InP cladding layer, the InGaAsP active layer, and the second InP cladding layer have a width substantially equal to that of the buried layer, and form a ridge including a double heterojunction structure (hereinafter referred to as DH structure). A second InP current blocking layer of the first conductivity type is disposed over the first InP current blocking layer such that the ridge with the DH structure is buried in the second current blocking layer. A contact layer of the other conductivity type is disposed over the first conductivity type InP current blocking layer and the second InP cladding layer so that it is in contact with the two layers.

When the first conductivity type is P-type, the second conductivity type is N-type, but the first and second conductivity types can be N-type and P-type, respectively.

In a semiconductor laser device, the configuration of current blocking layers is one of the most critical factors determinative of various characteristics, in particular, the temperature characteristic of the device. According to the present invention, the current blocking layers can be planar and have uniform thickness. In addition, according to the present invention, the carrier concentration of the current blocking layers can be controlled precisely. Further, the locations of the DH structure relative to the respective current blocking layers can be fully controlled by the use of an epitaxial growth technique, an etching technique or the like, so that the structure of the current blocking layers can be controlled so as to provide desired current blocking capability.

DETAILED DESCRIPTION OF PREFERRED EMBODIMENTS

Figure 1:
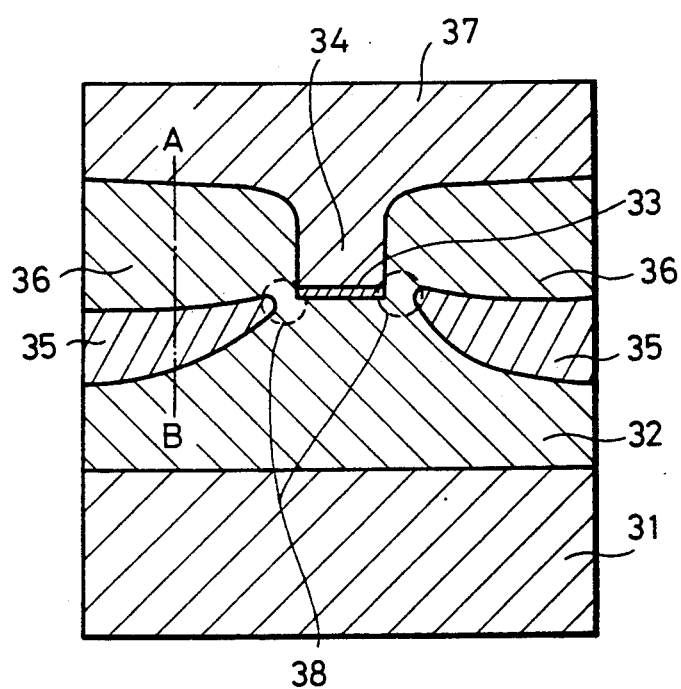
FIG. 1 is a cross-sectional view of a conventional semiconductor laser device.

Now, a semiconductor laser device and a manufacturing method according to the present invention are described in detail with reference to the drawings.

FIGS. 2(a)–2(g) show a first embodiment of the present invention. Steps 2(a)–2(g) correspond to steps shown in FIGS. 2(a)–2(g), respectively.

In Step 2(a), an N-type InP layer 21 having a carrier concentration of from $3 \times 10^{18}$ cm$^{-3}$ to $8 \times 10^{18}$ cm$^{-3}$, preferably $5 \times 10^{18}$ cm$^{-3}$, is grown to a thickness of from 1.0 μm to 1.5 μm on a P-type InP substrate 1 having a thickness of, for example, from 90 μm to 100 μm and having a carrier concentration of, for example, from $5 \times 10^{18}$ cm$^{-3}$ to $1 \times 10^{19}$ cm$^{-3}$.

In Step 2(b), a groove 3 having a width of about 2 μm is formed in the N-type InP layer 21 extending in depth to the P-type InP substrate 1. The N-type InP layer with the groove 3 formed therein is referred to as an N-type current blocking layer 2.

In Step 2(c), a P-type InP layer 41 is grown over the N-type InP current blocking layer 2 in such a manner as to fill the groove 3. The carrier concentration of the P-type InP layer 41 is from $1 \times 10^{18}$ cm$^{-3}$ to $3 \times 10^{18}$ cm$^{-3}$, preferably $2 \times 10^{18}$ cm$^{-3}$.

In Step 2(d), the portion of the P-type InP layer 41 lying over the N-type InP current blocking layer 2 is removed by etching, whereby a P-type InP buried layer 4 is left in the groove 3.

In Step 2(e), a P-type InP layer 51, which is to provide a P-type InP cladding layer, is grown to a thickness of from 0.1 μm to 0.3 μm over the surfaces of the P-type InP buried layer 4 and the N-type InP current blocking layer 2. The carrier concentration of the P-type InP layer 51 is from $1 \times 10^{18}$ cm$^{-3}$ to $3 \times 10^{18}$ cm$^{-3}$, preferably $2 \times 10^{18}$ cm$^{-3}$.

An InGaAsP layer 61, which is to provide an InGaAsP active layer, is formed to a thickness of, for example, not greater than 1 μm on the P-type InP layer 51. In this example, the InGaAsP layer 61 is undoped, although it may contain a P-type or N-type impurity.

Then, an N-type InP layer 71, which is to become an N-type InP cladding layer, is formed to a thickness of from 1.5 μm to 2 μm on the InGaAsP layer 61. The carrier concentration of the N-type InP layer 71 is from $1 \times 10^{18}$ cm$^{-3}$ to $5 \times 10^{18}$ cm$^{-3}$, preferably $2 \times 10^{18}$ cm$^{-3}$. The P-type InP layer 51, the InGaAsP layer 61, and the N-type InP layer 71 are planar.

In Step 2(f), the P-type InP layer 51, the InGaAsP layer 61, and the N-type InP layer 71 are subjected to wet etching or dry etching to thereby form a ridge 8 having a width substantially equal to that of the groove 3. Thus, the ridge 8 comprises a stack of a P-type InP cladding layer 5, an undoped InGaAsP active layer 6, and an N-type InP cladding layer 7, which are planar.

In Step 2(g), a P-type InP current blocking layer 9 is formed to bury the ridge 8 therein. Over the top surface of the P-type InP current blocking layer 9 and the surface of the uppermost N-type InP cladding layer 7 of the ridge 8, an N-type InP contact layer 10 of a desired thickness is grown to contact with both of the layers 9 and 7. The carrier concentration of the N-type contact layer 10 is preferably from $5 \times 10^{18}$ cm$^{-3}$ to $8 \times 10^{18}$ cm$^{-3}$.

In the above-described process, the respective layers can be formed highly controllably, by using an LPE (liquid phase epitaxy) technique, a reduced-pressure MOCVD technique, or other suitable technique. Since the N-type InP current blocking layer 2 can be planar on the substrate 1, highly uniform thickness and highly uniform carrier concentration, as desired, can be realized for the N-type InP current blocking layer 2. Since the P-type InP buried layer 4 can be completely buried by using the LPE, the reduced-pressure MOCVD, or another suitable technique, the position of the InGaAsP active layer 6 relative to the upper surface of the N-type InP current blocking layer 2 can be controllably and precisely established with only variations of from 0.1 μm to 0.3 μm at most.

If a buffer layer is required, it can be formed in the following manner. In Step 2(a), a P-type InP buffer layer is first disposed on the P-type InP substrate 1 and, then, the N-type InP layer 21 is disposed on this buffer layer. Thereafter, in Step 2(b), the groove 3 is formed in the N-type InP layer 21, which groove extends in depth to the buffer layer. After that, Steps 2(c)–2(g) are followed.

FIGS. 3(a)–3(c) illustrate a second embodiment of the present invention.

In Step 3(a) shown in FIG. 3(a), a surface of a P-type InP substrate 1 having a thickness of from 90 μm to 100 μm is etched to form a land 11 in a central portion of the substrate 1. The land has a width of about 2 μm and a height of from 1 μm to 1.5 μm. The cross-section of the land 11 is shown to be rectangular, but it may be inverted-trapezoidal with a shorter one of the parallel sides thereof being the bottom side.

In Step 3(b) shown in FIG. 3(b), an N-type InP layer 12 is formed by, for example, the LPE technique or the reduced-pressure MOCVD technique, to have a thickness which is at least equal to or slightly larger than the height of the land 11. The carrier concentration of the N-type InP layer 12 is from $3 \times 10^{18}$ cm$^{-3}$ to $8 \times 10^{18}$ cm$^{-3}$, preferably $5 \times 10^{18}$ cm$^{-3}$, as that of the N-type InP layer 21 shown in FIG. 2(a) of the first embodiment.

In Step 3(c) shown in FIG. 3(c), the N-type InP layer 12 is etched away to a thickness which is equal to the height of the land 11. Thus, the land 11 is buried in the N-type InP layer 12 on its opposite sides. That is, an N-type InP current blocking layer 2, which is the remaining N-type InP layer 12, with an N-type buried InP layer 4, which is the land 11, is formed.

Thereafter, the same steps as Steps 2(e)-2(g) shown in FIGS. 2(e) through 2(g) are followed. In a step corresponding to Step 2(e), a P-type InP layer 51, an undoped InGaAsP layer 61, and an N-type InP layer 71 are disposed in the named order on the surfaces of the N-type InP current blocking layer 2 and the N-type InP buried layer 4. The thus formed structure is subjected to etching to form a ridge 8 comprising a stack of a P-type InP cladding layer 5, an undoped InGaAsP active layer 6, and an N-type InP cladding layer 7, on the P-type InP buried layer 4. (See FIG. 2(f).) Finally, in a step corresponding to Step 2(g), the ridge 8 is buried in a P-type InP current blocking layer 9, and an N-type InP contact layer 10 of a desired thickness is grown over the P-type InP current blocking layer 9 and the N-type InP cladding layer 7.

If a buffer layer should be provided for the structure of the second embodiment, it can be formed in the following manner. A P-type InP buffer layer is first formed over the P-type InP substrate 1. Then, a P-type InP layer, which is to become the P-type InP buried layer, is disposed over the P-type InP buffer layer, and the P-type InP layer is etched to form the land 11, leaving the buffer layer on the substrate. This results in a structure of which the cross-sectional view is similar to the one shown in FIG. 3(a), but which comprises the substrate, the buffer layer on the substrate, and the land 11 on the buffer layer.

In this second embodiment, too, as in the first embodiment, the respective layers can be formed highly controllably, by using the LPE (liquid phase epitaxy) technique, the reduced-pressure MOCVD technique, or another suitable technique. Since the N-type InP current blocking layer 2 is planar on the substrate 1, highly uniform thickness and highly uniform carrier concentration as desired, can be realized for the N-type InP current blocking layer 2, and the position of the InGaAsP active layer 6 relative to the upper surface of the N-type InP current blocking layer 2 can be controllably and precisely established.

Figure 2:
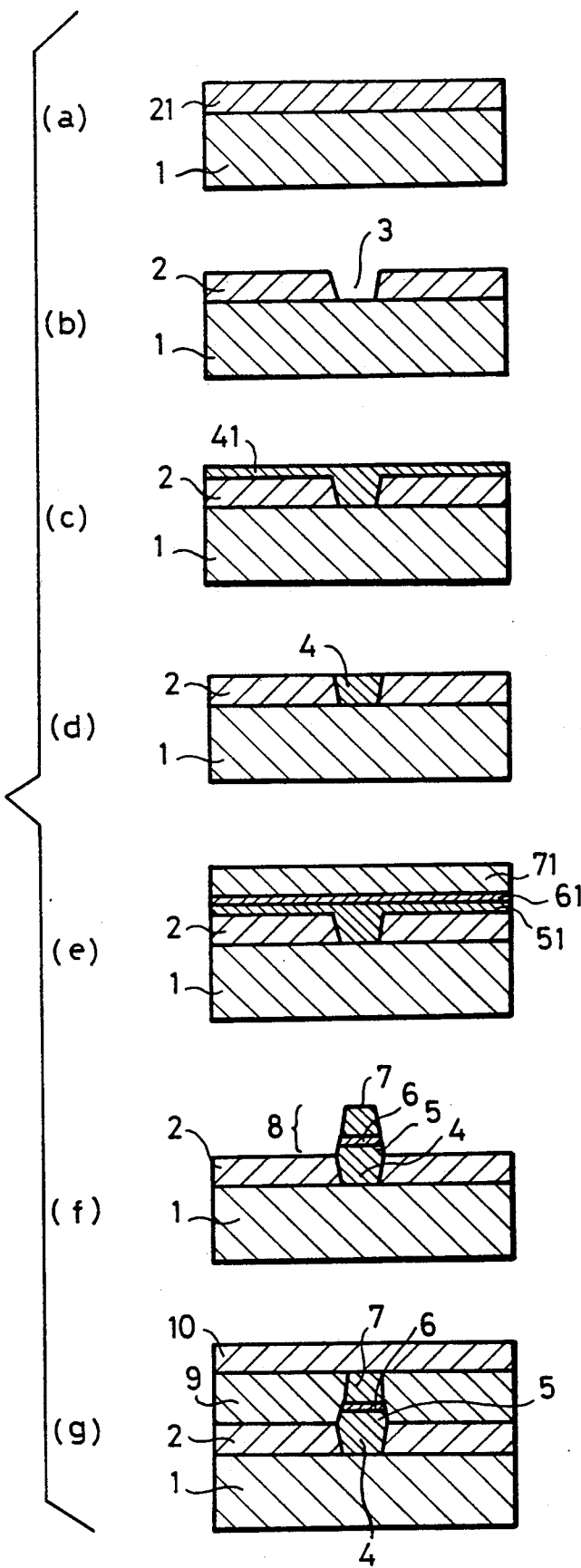
FIGS. 2(a)–2(g) show cross-sectional views of a semiconductor laser device in various steps in a manufacturing method according to a first embodiment of the present invention.
Figure 3:
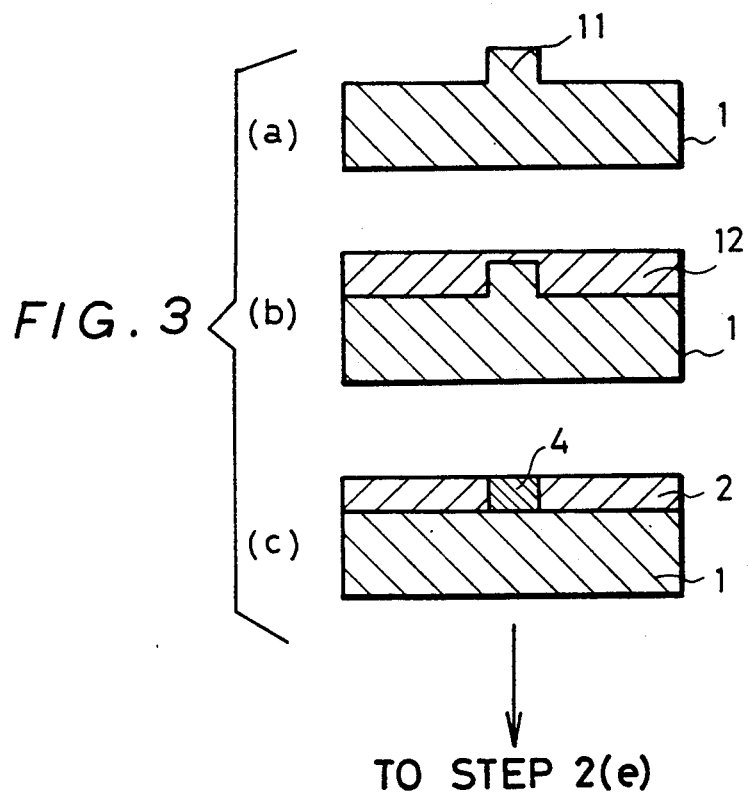
FIGS. 3(a)–3(c) show cross-sectional views of a semiconductor device in various steps in a manufacturing method according to a second embodiment of the present invention.
Figure 4:
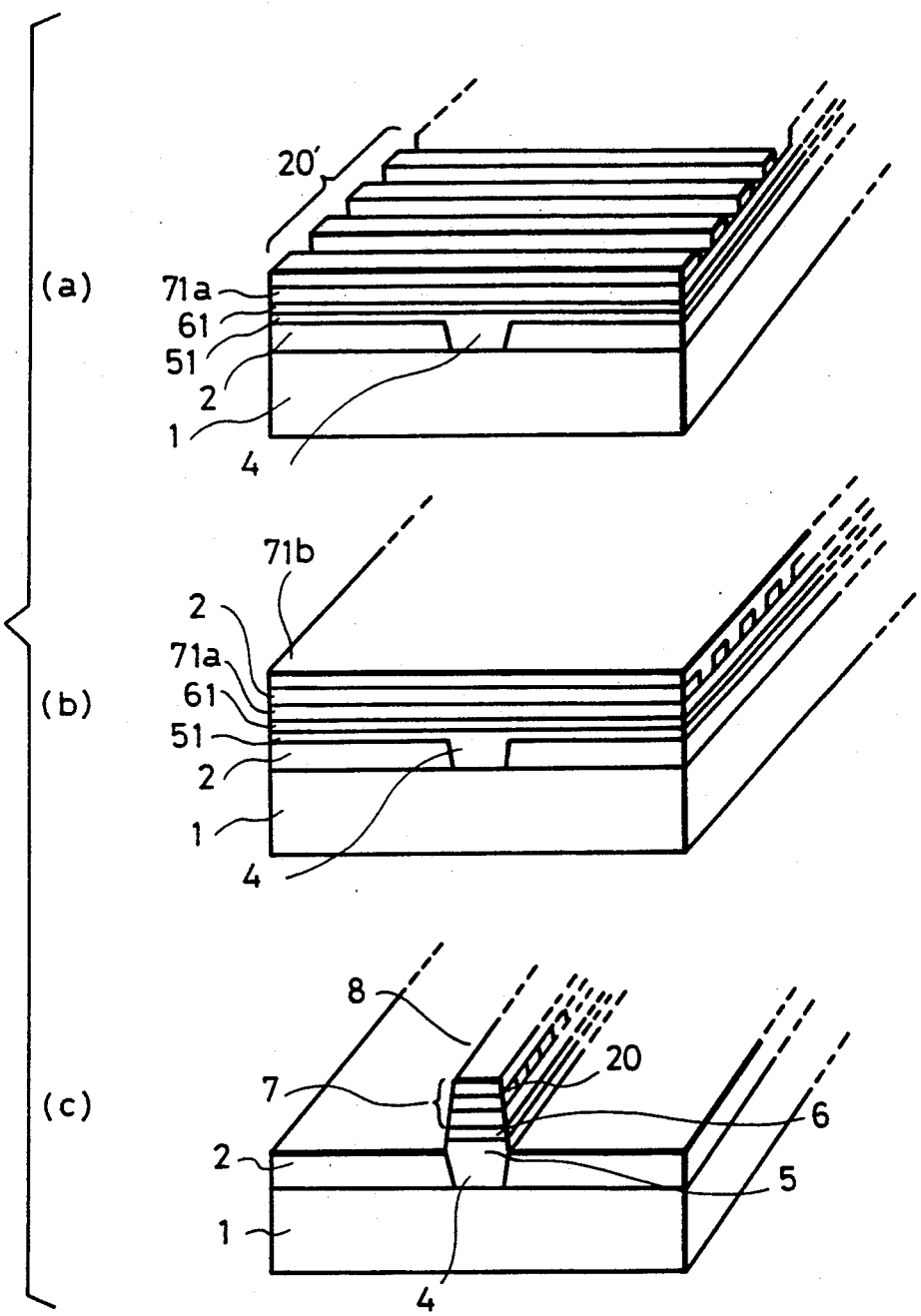
FIGS. 4(a)–4(c) are perspective views of a distributed feedback semiconductor laser device in some major steps in a manufacturing method according to the present invention.

A distributed feedback semiconductor laser device can be made by forming an InGaAsP diffraction grating layer 20 having a predetermined pitch and groove depth, in the N-type InP cladding layer 7 of the semiconductor laser device of FIG. 2 or 3, as shown in FIG. 4(c). The diffraction grating layer 20 may be formed in the following manner. As shown in FIG. 4(a), a diffraction grating layer 20' of InGaAsP, having a predetermined pitch and groove depth, is disposed over an N-type InP layer 71a. Then, as shown in FIG. 4(b), an N-type InP layer 71b is formed over the diffraction grating layer 20'. After that, an etching technique is used to form a ridge 8 as shown in FIG. 4(c). Thereafter, a P-type InP current blocking layer 9 and an N-type InP contact layer 10 are grown, in a manner as shown in FIG. 2(g), to complete a distributed feedback semiconductor laser device.

In each of the embodiments shown and described, the conductivity types of the substrate and the respective layers can be opposite to the ones described. That is, the substrate may be the N-type, and the current blocking layer 2 the P-type, the buried layer 4 the N-type, the cladding layer 5 the N-type, the cladding layer 7 the P-type, the current blocking layer 9 the N-type, and the contact layer 10 can be the P-type. The active layer 6 can be the N-type, the P-type, or undoped.

As described above, according to the present invention, current blocking layers, which are the most important layers for InP semiconductor laser devices, can be formed stably so as to have a uniform thickness and a uniform carrier concentration. Furthermore, the distance of the InGaAsP active layer 6 from the current blocking layers can be determined precisely. Thus, according to the present invention, high quality InP semiconductor laser devices which are rarely driven into thyristor conduction during operation, have small leakage current, and have good temperature characteristics, can be fabricated with a high yield.

What is claimed is:

1. A semiconductor laser device comprising:
   an InP substrate of a first conductivity type;
   a first InP current blocking layer of a second conductivity type opposite said first conductivity type disposed on said substrate;
   an InP buried layer of said first conductivity type disposed on said substrate, surrounded by said first current blocking layer, and having the same thickness as said first current blocking layer;
   a ridge including a double heterojunction structure comprising a first InP cladding layer of said first conductivity type, an InGaAsP active layer, and a second InP cladding layer of said second conductivity type, said first cladding layer, said active layer, and said second cladding layer being substantially planar and stacked in the named order on said InP buried layer, said ridge and InP buried layer each having a width, said widths being substantially the same;
   a second InP current blocking layer of said first conductivity type disposed on said first InP current blocking layer surrounding said ridge; and
   a contact layer of said second conductivity type disposed opposite and in contact with said second InP current blocking layer and said second InP cladding layer.

2. A semiconductor laser device according to claim 1 wherein said first InP current blocking layer and said InP buried layer surrounded by said first InP current blocking layer are disposed on said InP substrate of said first conductivity type with an InP buffer layer of said first conductivity type disposed therebetween.

3. A semiconductor laser device comprising:
   an InP substrate of a first conductivity type;
   a first InP current blocking layer of a second conductivity type opposite said first conductivity type disposed on said substrate;
   an InP buried layer of said first conductivity type disposed on said substrate, surrounded by said first current blocking layer, and having the same thickness as said first current blocking layer;
   a ridge including a double heterojunction structure comprising a first InP cladding layer of said first conductivity type, an InGaAsP active layer, and a second InP cladding layer of said second conductivity type, said first cladding layer, said active layer, and said second cladding layer being substantially planar and stacked in the named order on said InP buried layer, said ridge and InP buried layer each having a width, said widths being substantially the same;

a second InP current blocking layer of said first conductivity type disposed on said first InP current blocking layer surrounding said ridge;

a contact layer of said second conductivity type disposed opposite and in contact with said second InP current blocking layer and said second InP cladding layer; and a diffraction grating layer of InGaAsP disposed in said second InP cladding layer.

4. A semiconductor laser device according to claim 3 wherein said first InP current blocking layer and said InP buried layer surrounded by said first InP current blocking layer are disposed on said InP substrate of said first conductivity type with an InP buffer layer of said first conductivity type disposed therebetween.

* * * * *